United States Patent
Manassen et al.

(10) Patent No.: US 11,615,974 B2
(45) Date of Patent: Mar. 28, 2023

(54) FAB MANAGEMENT WITH DYNAMIC SAMPLING PLANS, OPTIMIZED WAFER MEASUREMENT PATHS AND OPTIMIZED WAFER TRANSPORT, USING QUANTUM COMPUTING

(71) Applicant: KLA CORPORATION, Milpitas, CA (US)

(72) Inventors: Amnon Manassen, Haifa (IL); Tzahi Grunzweig, Hillsboro, OR (US); Einat Peled, Pardes Hanna-Karkur (IL); Anna Golotsvan, Qiryat Tivon (IL)

(73) Assignee: KLA CORPORATION, Milpitas, CA (US)

( * ) Notice: Subject to any disclaimer, the term of this patent is extended or adjusted under 35 U.S.C. 154(b) by 595 days.

(21) Appl. No.: 16/483,599

(22) PCT Filed: Jul. 5, 2019

(86) PCT No.: PCT/US2019/040665
§ 371 (c)(1),
(2) Date: Aug. 5, 2019

(87) PCT Pub. No.: WO2021/006858
PCT Pub. Date: Jan. 14, 2021

(65) Prior Publication Data
US 2021/0335638 A1    Oct. 28, 2021

(51) Int. Cl.
*H01L 21/67*     (2006.01)
*G06N 10/00*    (2022.01)
(Continued)

(52) U.S. Cl.
CPC ...... *H01L 21/67276* (2013.01); *G05B 19/401* (2013.01); *G05B 19/4063* (2013.01);
(Continued)

(58) Field of Classification Search
CPC .............. G05B 19/401; G05B 19/4063; G05B 19/41875; G05B 21/02;
(Continued)

(56) References Cited

U.S. PATENT DOCUMENTS

2003/0022399 A1    1/2003  Chiou et al.
2007/0282549 A1*  12/2007  Behm .............. G05B 19/41865
                                                          702/81
(Continued)

FOREIGN PATENT DOCUMENTS

EP         3352013 A1       7/2018
KR      20150067081 A        6/2016
WO       2019/143371         7/2019

OTHER PUBLICATIONS

WIPO, ISR for PCT/US2019/040665, Apr. 3, 2020.

*Primary Examiner* — Kidest Bahta
(74) *Attorney, Agent, or Firm* — Hodgson Russ LLP

(57) ABSTRACT

Systems and methods of optimizing wafer transport and metrology measurements in a fab are provided. Methods comprise deriving and updating dynamic sampling plans that provide wafer-specific measurement sites and conditions, deriving optimized wafer measurement paths for metrology measurements of the wafers that correspond to the dynamic sampling plan, managing FOUP (Front Opening Unified Pod) transport through the fab, transporting wafers to measurement tools while providing the dynamic sampling plans and the wafer measurement paths to the respective measurement tools before or as the FOUPs with the respective wafers are transported thereto, and carrying out metrology and/or inspection measurements of the respective wafers by the respective measurement tools according to the derived wafer measurement paths. Quantum computing resources may be used to solve the corresponding specific optimization problems, to reduce the (Continued)

required time, improve the calculated solutions and improve the fab yield and accuracy of the produced wafers.

30 Claims, 3 Drawing Sheets

(51) Int. Cl.
*G05B 19/401* (2006.01)
*G05B 19/4063* (2006.01)
*G05B 19/418* (2006.01)

(52) U.S. Cl.
CPC ....... *G05B 19/41875* (2013.01); *G06N 10/00* (2019.01); *H01L 21/67253* (2013.01); *G05B 2219/31281* (2013.01); *G05B 2219/32199* (2013.01); *G05B 2219/37224* (2013.01)

(58) Field of Classification Search
CPC ........... G05B 2219/31281; G05B 2219/32199; G05B 2219/37224; G06N 10/00; H01L 21/67253; H01L 21/67276; Y02P 90/02
See application file for complete search history.

(56) References Cited

U.S. PATENT DOCUMENTS

| | | | | |
|---|---|---|---|---|
| 2009/0317924 | A1* | 12/2009 | Ouyang | ............ H01L 21/67276 707/999.107 |
| 2011/0015773 | A1* | 1/2011 | Wilby | ............... H01L 21/67253 700/109 |
| 2014/0336811 | A1* | 11/2014 | Yuki | .................. G05B 19/4093 700/213 |
| 2015/0124247 | A1* | 5/2015 | Park | ...................... G01N 21/93 356/237.5 |
| 2015/0162180 | A1 | 6/2015 | Grau et al. | |
| 2017/0255188 | A1* | 9/2017 | Izikson | ............... G03F 7/70633 |
| 2018/0134491 | A1 | 5/2018 | Dovids et al. | |
| 2019/0369503 | A1 | 12/2019 | Ypma et al. | |

* cited by examiner

FAB MANAGEMENT WITH DYNAMIC SAMPLING PLANS, OPTIMIZED WAFER MEASUREMENT PATHS AND OPTIMIZED WAFER TRANSPORT, USING QUANTUM COMPUTING

BACKGROUND OF THE INVENTION

1. Technical Field

The present invention relates to the field of semiconductors production, and more particularly, to optimization of production and metrology processes using quantum computing.

2. Discussion of Related Art

As Moore's law advances, multiple sophistication and complexity of processes in semiconductor fabs (semiconductor fabrication plants) arise. Wafers are typically moved between production tools that apply production steps (e.g., forming device and target elements in layers on the wafers) and metrology and/or inspection tools which measure target sites on the wafers and verify that the production steps are carried out correctly (within the defined specifications). Metrology tools carry out the metrology measurements using a measurement recipe, which is typically predetermined using initial training or simulation data, and applied uniformly to all the wafers (at least in one or more wafer lots)—to yield measurement data that is processed by one or more processor(s) that control the production process, as well as the physical movements of the wafers through the fab, among the production and measurement tools.

As examples for the process complexity, (i) managing wafer transportation (in thousands of FOUPs—Front Opening Unified Pods, which are means for holding and transferring silicon wafers between tools) between hundreds of tools (e.g., for performing process steps such as Etch, CMP—chemical mechanical processing, deposition, implantation, and lithography, and for performing metrology and inspection steps) is a daunting optimization problem, especially in foundries that offer many processing flavors to different customers with different levels of urgency; (ii) there is an increase in required metrology sampling per wafer from several hundred points per wafer to over a thousand points per wafer, due to the increased sensitivity of measurements to process variations, matching between scanner types and more; (iii) metrology and inspection increases both in quantity and sophistication as more data is collected and is analyzed in complex methods such as big data techniques, machine learning, etc. These data analysis methods are expected to increase in sophistication and could pose a challenge to current on tool computing infrastructure.

Concerning (i), the fab optimization process includes planning, scheduling, costing, statistical process control and more and are performed by dedicated systems called manufacturing execution system (MES). However, these optimization problems grow quickly in complexity and requirements for computing resources and gradually require more time than a running fab can afford.

Concerning (ii), pre-defined metrology sampling plans are typically adaptive per wafer or lot according to a priori knowledge such as results of previous measurement of different types that indicate the metrology sensitivity to process variations. For example, a previous overlay measurement flag may be used to indicate that the next measurement of the same or a neighboring site could be a flyer (exceptional) or contribute to residuals and thus should be omitted from the sampling plan. Another motivation for a varying sampling plan is distributing overlay measurements between lot wafers for overcoming known process variation distributions and reduce number of samples. As processes become more complex, sampling plans become more populated with points per wafer and with points being distributed less systematically across the wafer, possibly changing points distribution between wafers. In this reality, the path optimization, namely the path the wafer takes in the metrology tool between measurement points becomes crucial for the amount of time the wafer spends on the tool for measurement. This means that path optimization is important for throughput (TPT—Throughput Time). Best path optimization schemes currently used in overly tools is based on a near neighbor algorithm that is a compromise between TPT and path optimization calculation time. As computing power increases, more sophisticated algorithms can be used for path optimization.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a method of optimizing wafer transport and metrology measurements in a semiconductor fabrication plant (fab), the method comprising: deriving and updating dynamic sampling plans that provide wafer-specific measurement sites and conditions, wherein the dynamic sampling plans differ between wafers, deriving optimized wafer measurement paths for metrology measurements of the wafers that correspond to the respective derived and updated dynamic sampling plan, managing FOUP (Front Opening Unified Pod) transport through the fab, transporting wafers to measurement tools while providing the dynamic sampling plans and the wafer measurement paths to the respective measurement tools before or as the FOUPs with the respective wafers are transported thereto, and carrying out metrology and/or inspection measurements of the respective wafers by the respective measurement tools according to the derived wafer measurement paths.

One aspect of the present invention provides a system for optimizing wafer transport and metrology measurements in a semiconductor fabrication plant (fab), the system comprising: a sampling plan optimization module configured to derive and update dynamic sampling plans that provide wafer-specific measurement sites and conditions, wherein the dynamic sampling plans differ between wafers, a measurement path optimization module configured to derive optimized wafer measurement paths for metrology measurements of the wafers that correspond to the respective derived and updated dynamic sampling plan, a FOUP transport optimization module configured to manage FOUP transport through the fab, transporting wafers to measurement tools while providing the wafer measurement paths to the respective measurement tools before or as the FOUPs with the respective wafers are transported thereto, wherein the respective measurement tools are configured to carry out metrology and/or inspection measurements of the respective wafers according to the derived wafer measurement paths.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
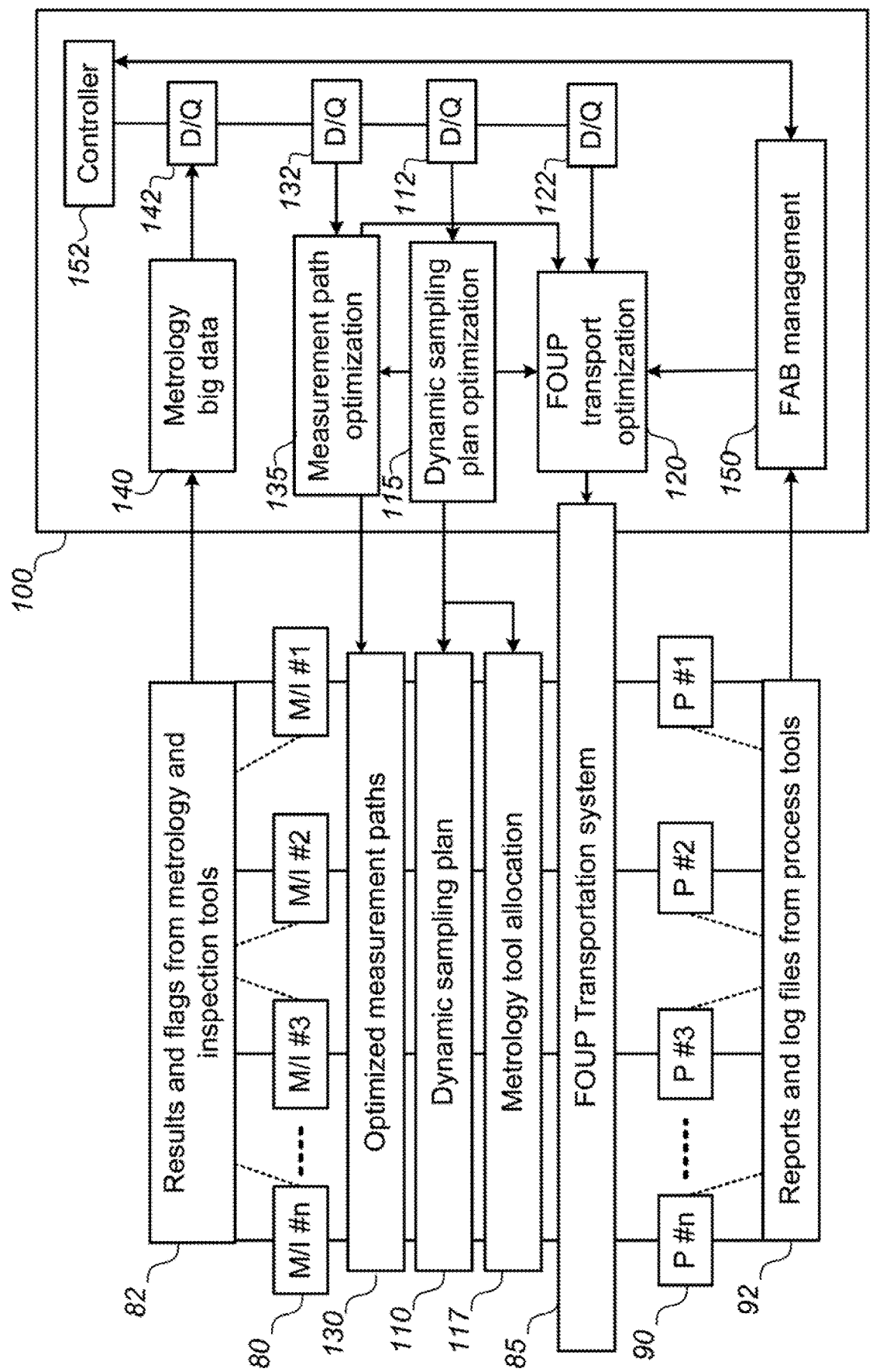
FIG. 1 is a high-level schematic illustration of a system for optimizing wafer transport and metrology measurements in a semiconductor fabrication plant (fab), according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In certain embodiments, illumination technology may comprise, electromagnetic radiation in the visual range, ultraviolet or even shorter wave radiation such as x rays, and possibly even particle beams.

Embodiments of the present invention provide efficient and economical methods and mechanisms for optimizing and managing a range of semiconductor fabrication plant (fab) processes such as wafer traffic, wafer sampling plan path, and metrology data analysis, and thereby provide improvements to the technological field of semiconductor production. Systems and methods of optimizing wafer transport and metrology measurements in a fab are provided. Methods comprise deriving and updating dynamic sampling plans that provide wafer-specific measurement sites and conditions, deriving optimized wafer measurement paths for metrology measurements of the wafers that correspond to the dynamic sampling plan, managing FOUP (Front Opening Unified Pod) transport through the fab, transporting wafers to measurement tools while providing the dynamic sampling plans and the wafer measurement paths to the respective measurement tools before or as the FOUPs with the respective wafers are transported thereto, and carrying out metrology and/or inspection measurements of the respective wafers by the respective measurement tools according to the derived wafer measurement paths. Quantum computing resources may be used to solve the corresponding specific optimization problems, to reduce the required time, improve the calculated solutions and improve the fab yield and accuracy of the produced wafers. It is noted that the term "fab" as used herein relates to both fabrication plants which include the design operations in addition to the device fabrication operation, as well as to foundries, which typically handle only the fabrication operation, typically for multiple customers.

FIG. 1 is a high-level schematic illustration of a system 100 for optimizing wafer transport and metrology measurements in a semiconductor fabrication plant (fab), according to some embodiments of the invention. System 100 may be configured to improve performance of fabs which schematically comprise a plurality of process tools 90 (denoted P #1, P #2, P #3 . . . P #n) configured to process the wafers and deliver reports and log files 92, a plurality of metrology and/or inspection tools 80 (denoted M/I #1, M/I #2, M/I #3 . . . M/#n) configured to measure the wafers and provide results and flags 82, and a FOUP (Front Opening Unified Pod) transportation system 85 configured to deliver wafers to process tools 90 and to metrology and inspection tools 80.

In various embodiments, system 100 comprises modules and implements approaches that enhance the throughput of the fab, improve process accuracy and/or handle the ever-increasing wealth of process-related data and metrology data about the wafers. Advantageously, systems 100 and methods 200 described herein may be configured to implement dynamic sampling plans by providing specific sampling plans and/or related measurement paths per wafer and/or per FOUP according to any of, e.g., previous metrology and/or inspection measurements 82 of the same wafer by the same tool(s) 80, previous metrology and/or inspection measurements 82 of the same wafer by other tools(s) 80, any a priori data about the wafer such as process tools log files 92, statistical distributions of sampling results within the FOUP and between FOUPs that are used to derive improved modeling and reduced residuals and/or overall TPT (throughput time) data. The dynamic sampling plans may be calculated and/or optimized by system 100, possibly implementing quantum computer(s) and/or processor(s), and may be sent to the respective tool(s) 80, 90 in parallel to the FOUP transportation by system 85, so that when the wafer loads to the tool, the tool is ready with the updated sampling plan and related measurement path. Systems 100 may be configured to provide sampling plan(s) and measurement path(s) to respective tool(s) before or as corresponding wafer(s) are transported to the tool(s), to enable immediate measurement and/or to alleviate the computational load on the tools themselves.

For example, in certain embodiments, system 100 comprises a dynamic sampling plan optimization module 115 configured to derive and update dynamic sampling plans 110 that provide wafer-specific measurement sites and conditions, and between the wafers. For example, dynamic sampling plan 110 may define specific sites and positions within the sites that are to be measured on each wafer. Dynamic sampling plan 110 may vary between wafers according to related production processes and stages, identifies process errors or inaccuracies and previous measurements of the same of other wafers—all of which may be used to indicate preferable measurement sites that can be incorporated in dynamic sampling plan 110 and change it as the production of the wafers proceeds. Dynamic sampling plan optimization module 115 may be configured to update dynamic sampling plan 110 according to the analyzed metrology and/or inspection measurements. Dynamic sampling plan 110 may be adjusted during the process to identify process errors as they appear and possibly correct them on the fly.

The timing of provision of dynamic sampling plan 110 to metrology and/or inspection tools 80 may be determined as part of the rest of the production process, e.g., be related to (optimized) wafer movement through the fab, to determined (optimized) movement patterns over the sites on each wafer and to the (optimized) selected metrology tool 80, as described below.

In various embodiments, dynamic sampling plan optimization module 115 may comprise or be associated with a dedicated processor 112 configured to carry out the optimization of dynamic sampling plan 110. Dedicated processor 112 may comprise at least one quantum computer (indicated in FIG. 1 as D/Q for dedicated, possibly Quantum processor), possibly configured to carry out the sampling plan optimization problem.

In certain embodiments, system 100 comprises a measurement path optimization module 135 configured to derive optimized wafer measurement paths 130 for metrology measurements of the wafers that correspond to respective derived and updated dynamic sampling plan 110. The inventors note that measurement paths become more complex as the number of metrology measurement sites continuously increases due to the shrinking device dimensions and increased device complexity (e.g., prior art wafers typically include hundreds of metrology measurement sites while future wafers are expected to include thousands of metrology measurement sites). Moreover, device complexity also requires stricter accuracy specifications leading to smaller and more numerous targets, which may optionally be set in-die and further complicate the measurement paths. Finally, the more complex devices and more numerous targets are also produced and measured by more tools, compounding the complexity of the process and the management of production. Disclosed measurement path optimization module 135 may be configured to handle the increasing complexity by deriving more efficient measurement paths among targets on the wafers, thereby shortening the measurement time and decreasing required stage movements.

In various embodiments, measurement path optimization module 135 may be configured to complement and/or replace measurement path calculations at metrology and/or inspection tools 80. For example, optimized measurement paths 130 may be derived from respective dynamic sampling plans 110 and delivered to corresponding tool 80 before or as the wafers are delivered thereto. Alternatively or complementarily, measurement path optimization module 135 may be configured to support, computationally, respective measurement tools 80 in their derivation of wafer measurement paths for metrology measurements from the respective derived and updated dynamic sampling plan 110.

In various embodiments, measurement path optimization module 135 may comprise or be associated with a dedicated processor 132 configured to carry out the optimization of measurement paths 130. Dedicated processor 132 may comprise at least one quantum computer (indicated in FIG. 1 as D/Q for dedicated, possibly Quantum processor), possibly configured to carry out the measurement path optimization problem. For example, measurement path optimization module 135 may be configured to optimize wafer measurement path 130 with respect to wafer measurement speed and according to a given measurement time specified by dynamic sampling plan 110, e.g., by implementing at least one TSP (Travelling Salesman Problem) algorithm or equivalent algorithms. In certain embodiments, the TSP algorithm(s) or equivalent algorithms may be adjusted to be processed by at least one quantum computer, such as dedicated processor 132.

The inventors have noted that the complex measurement path optimization problem can be understood as being similar to TSP, aimed at finding the shortest possible route that visits each city and returns to the origin city, with respect to a given list of cities and the distances between each pair of cities. The measurement path optimization problem can be seen as being analogous to TSP with measurement sites over the wafers being analogous to different cities and the point of origin being analogous to the measurement point for which the wafer is closest to the loader robot that loads and unloads the wafer from the tool. The shortest traveling salesman path is analogous to the shortest time the wafer spends on the tool. This understanding stands in contrast to current path selection methods which include using a single sampling plan per layer, which is changed manually from time to time, systematically traversing the wafer in straight lines for consecutive measurements, using nearest neighbor algorithms for path optimization in consecutive measurement, using the tools' computer for path optimization—which consequently requires more points per wafer for a single sampling plan than required to give the best correctibles (metrology parameters) and is under-optimized to overcome specific process variation distribution over the wafer. Moreover, current methods are known for not yielding the shortest TSP path. As TSP falls into a category called "discrete optimization problem" it is well suited, in principle, to be solved, e.g., by a quantum computer type called "quantum annealer" which can be implemented as at least part of measurement path optimization module 135, to provide a dramatic breakthrough in computing speed, as the shortest path may be found by the quantum nature of the computer enabling "tunneling" to the best solution.

For example, measurement path optimization may be started when the wafer is conveyed to the production tool using, e.g., a priory knowledge, previous measurement results (of different types), multi-wafer optimization schemes and/or other optimization inputs. TSP algorithms may be configured to provide the best tradeoff between computing time and wafer measurement time for any given computing power and measurement speed. Moreover, in certain embodiments, using measurement path optimization module 135 with dedicated processors may remove prior art limitation of computing time and available computing power from limiting the wafer sampling process optimization. For example, 5D infrastructure with past measurement history per wafer and modeling and/or accuracy preferences may be used to determine the best sampling plan per wafer. In certain embodiments, measurement path optimization module 135 may further be configured to carry out the optimizing dynamically with respect to multiple wafers and/or wafer lots. For example, a dynamic sampling plan may be used for improved performance as discussed above. Advantageously, as the number of measurements per wafer and wafer measurement time are critical commercial parameters, their optimization is highly beneficial to improve overall semiconductor production efficiency. Advantageously, using measurement path optimization module 135 may remove prior art limitation of computing time and available computing power from limiting the wafer sampling process optimization.

In certain embodiments, measurement tools 80 may comprise at least one stepwise operating metrology tool and at least one scanning metrology tool. Examples for scanning metrology tools are provided in WIPO Application No. PCT/US18/18588, incorporated herein by reference in its entirety, teaching on-the-fly derivation of metrology target position on the wafer and possibly the target focus position during the movement of the wafer on the system's stage. The positioning data may be derived before the target arrives its position (on-the-fly), sparing the time required in the prior art for the acquisition stage and increasing the throughput of the systems and methods. The collection channel may be split to provide for an additional moving-imaging channel comprising at least one TDI (time delay and integration) sensor with an associated analysis unit configured to derive wafer surface information, positioning and/or focusing information of the metrology targets with respect to the objective lens, during wafer positioning movements towards the metrology targets. Additional focusing-during-movement module and possibly feedbacking derived position and/or focus information to the stage may enhance the accuracy of the stopping of the stage. As the number of sites increases from hundreds to thousands per wafer, scanning metrology tools may be applied for multiple adjacent sites on the wafer, e.g., as part of dynamic sampling plan 110. For example, scanning metrology tools may be applied to stretches of adjacent sites while stepwise operating metrology tools may be applied to sites remote from each other. In certain embodiments, sampling plan optimization module 115 may be configured to optimize the used scanning/stepwise operating metrology tools, e.g., with respect to the time of travel within and between sites and with respect to measurement parameters such as illumination and accuracy, according to the required metrology performance. Parameters of the scanning tools may be part of optimized dynamic sampling plan 110. System 100 may be further configured to allocate sufficient memory and processing power for handling measurements by scanning tools in a way that compensates for the challenges of measurement during movement, such as lower illumination and integration of multiple grabs. Big data approaches may be applied to the scanning measurements, as discussed below. Dedicated (e.g., quantum) processors or computers 112 may be applied to handle scanning metrology tools and optimize their integration within dynamic sampling plan 110 and the production process in the fab as a whole.

In certain embodiments, system 100 may be configured to co-optimize dynamic sampling plan 110 and wafer measurement paths 130 with respect to an allocation 117 of stepping and the scanning metrology tools 80, to minimize wafer measurement time. For example, the scanning metrology tools may be allocated to measure stretches of adjacent wafer sites, as long as switching between the types of metrology tools does not result in a time penalty that is too large with respect to the time saved by the scanning tool.

In certain embodiments, system 100 comprises a metrology big data analysis module 140 configured to apply big data analysis procedures to analyze the metrology and/or inspection measurements. In various embodiments, big data approaches may be implemented to metrology measurements to enhance the information derived from the measurements, and to extract additional information from multiple, previously unrelated measurements. For example, over-measurement, which currently may be detrimental to the metrology output, may be utilized to derive more exact results in the big data approach (e.g., using artificial intelligence (AI) algorithms), such as identifying a global minimum of residual inaccuracies rather than currently identified local minima. In big data approaches, metrology algorithms may be configured to utilize current as well as past measurements, and may not be limited to the type to metrology measurements used in the modelling, e.g., both images and interferometry measurements, as well as measurement under multiple conditions such as illumination parameters may be utilized in deriving the metrology results. Moreover, big data approaches may be used to analyze measurement data from scanning metrology tools, which may be more extensive and require more processing with respect to data from stepwise operating metrology tools, as disclosed above. Dedicated (e.g., quantum) processors or computers 142 may be applied to handle big data from metrology tools 80 and to optimize their analysis, enabling further or more frequent updating of dynamic sampling plan 110 and improving the production process in the fab as a whole.

In certain embodiments, system 100 comprises a FOUP (Front Opening Unified Pod) transport optimization module 120 configured to manage FOUP transport through the fab (by FOUP transportation system 85) transporting wafers to measurement tools 80 while providing wafer measurement paths 130 to respective measurement tools 80 before or as the FOUPs with the respective wafers are transported thereto.

In various embodiments, FOUP transport optimization module 120 may comprise or be associated with a dedicated processor 122 configured to carry out the optimization of FOUP transport among the multitude of process tools 90 and metrology/inspection tools 80 in the fab, and with respect to dynamic sampling plan 110 and estimated durations of processes and measurements (e.g., in relation to measurement paths 130). Dedicated processor 122 may comprise at least one quantum computer (indicated in FIG. 1 as D/Q for dedicated, possibly Quantum processor), possibly configured to carry out the FOUP transport optimization problem.

In certain embodiments, system 100 comprises a fab management module 150 and/or a system controller 152, configured to provide dynamic sampling plans 130 and wafer measurement paths 130 to measurement tools 80 before or as the FOUPs with respective wafers are transported to the respective measurement tools, wherein respective measurement tools 80 are configured to carry out metrology and/or inspection measurements of the respective wafers according to dynamic sampling plans 130 and derived optimized wafer measurement paths 130. Fab management module 150 and/or system controller 152 may be further configured to allocate wafers to various process tools 90 and metrology/inspection tools 80 to produce specified devices on the wafers and to measure the produced features to ensure their compatibility with specifications. Fab management module 150 may comprise or be associated with controller 152 that manages system 100 and modules 115, 120, 135, 140 and dedicated processors 112, 122, 132, 142, when implemented. Fab management module 150 and/or system controller 152 may comprises at least one of a centralized quantum computer, a network of quantum computers, a network of co-optimized quantum and classical computers and/or a network service comprising any thereof; and may be associated with any of dedicated, optionally quantum processors 112, 122, 132 and 142.

Certain embodiments comprise system 100 for optimizing wafer transport and metrology measurements in the fab, comprising sampling plan optimization module 115 configured to derive and update dynamic sampling plans 110 that provide wafer-specific measurement sites and conditions, differing between wafers, FOUP transport optimization module 120 configured to manage FOUP transport through the fab transporting wafers to measurement tools while providing dynamic sampling plans 110 to the respective measurement tools before or as the FOUPs with the respective wafers are transported thereto. Respective measurement tools 80 may be configured to carry out metrology and/or inspection measurements of the respective wafers according to wafer measurement paths 130, provided, e.g., by system 100, calculated by respective tool 80, optionally with computational support from system 100 (e.g., by measurement path optimization module 135 or a respective processor such as dedicated processor 132).

Certain embodiments comprise system 100 for optimizing wafer transport and metrology measurements in the fab, comprising: measurement path optimization module 135 configured to derive respective optimized wafer measurement paths 130 for metrology measurements of the wafers from dynamic sampling plans 110, FOUP transport optimization module 120 configured to manage FOUP transport through the fab, transporting wafers to measurement tools while providing the wafer measurement paths to the respective measurement tools before or as the FOUPs with the respective wafers are transported thereto. Respective measurement tools 80 may be configured to carry out metrology and/or inspection measurements of the respective wafers according to wafer measurement paths 130 and dynamic sampling plans 110.

Advantageously, disclosed embodiments provide better solutions to the fab optimization problem than the current MES (manufacturing execution system) approach and moreover enable real-time optimization of the wafer handling processes in the fab. Alternatively or complementarily, MES algorithms may be modified for processing by corresponding dedicated, e.g., quantum computers of system 100. Advantageously, improved fab optimization may increase the fab throughput and reduce its operation cost.

Advantageously, as quantum computers may be configured to handle specific hard optimization problems much more efficiently than classical computers, they may be applied to solve the wafer transportation optimization problem (e.g., in a TSP-related formulation) within system 100, e.g., by FOUP transport optimization module 120. In certain embodiments, quantum computers 115 may be configured to handle the problem of movements among sites on each wafer, particularly as number of sites rises to be in the thousands, e.g., by measurement path optimization module 135. In certain embodiments, especially with fabs being foundries supplying devices to many customers, system 100 may be configured to optimize the production plans with respect to other optimized aspects of the production process, as disclosed herein, such as specific customer requirements (e.g., by fab management module 150). In certain embodiments, quantum computers may be used in system 100, e.g., in fab management module 150 and/or in controller 152, to handle the problem of finding a global (rather than a local) minimum in the fitting of the metrology and/or inspection measurements to the corresponding models, to minimize the correctibles—which is a problem that becomes harder as the number of sites increases. In various embodiments, dedicated quantum computer modules may be integrated with classical computers to provide fast solutions to these or other optimization problems disclosed herein, yielding hybrid controller 152 and/or hybrid system 100.

Elements from two or more disclosed embodiments of system 100 may be combined in any operable combination, and the illustration of the modules in FIG. 1 merely serves an explanatory purpose and is non-limiting. Specifically, disclosed combinations may optimize any of the wafer traffic in the fab, the wafer sampling plan paths, and the analysis of complex semiconductor metrology and inspection data, using quantum computing.

Figure 2:
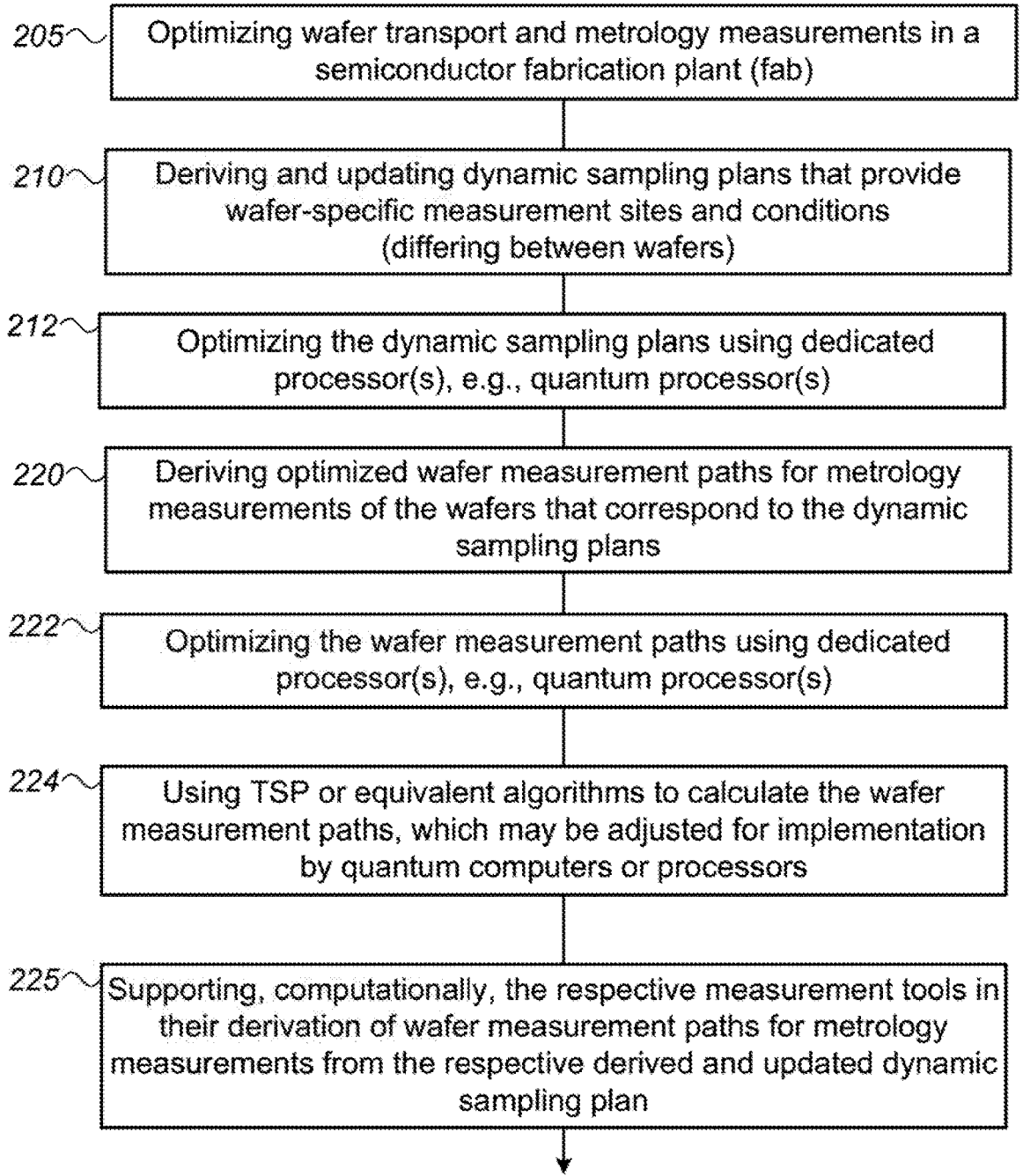
FIG. 2 is a high-level flowchart illustrating a method of optimizing wafer transport and metrology measurements in the fab, according to some embodiments of the invention.
Figure 2:
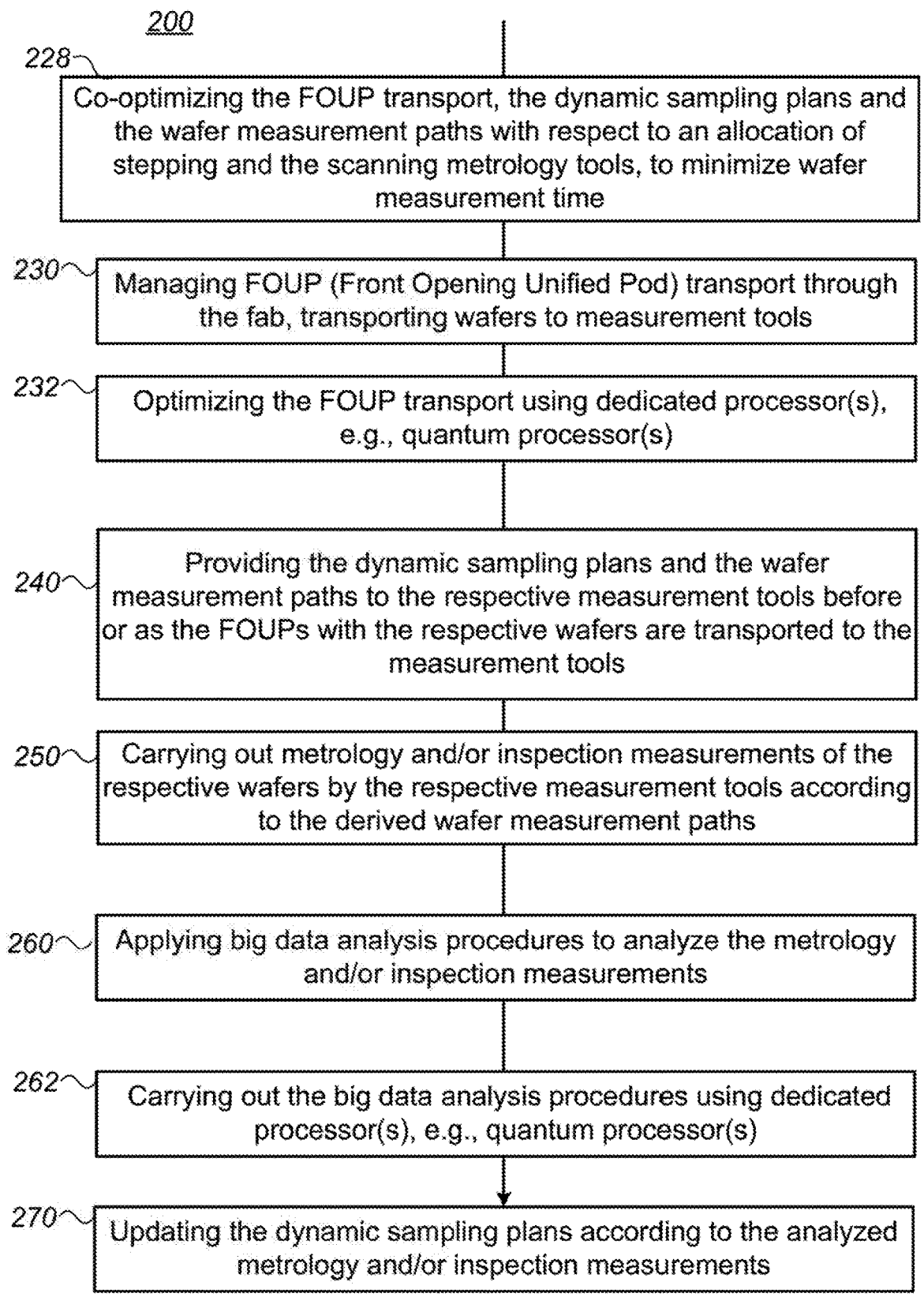

FIG. 2 is a high-level flowchart illustrating a method 200 of optimizing wafer transport and metrology measurements in a semiconductor fabrication plant (fab) (stage 205), according to some embodiments of the invention. The method stages may be carried out with respect to system 100 described above, which may optionally be configured to implement method 200. Method 200 may be at least partially implemented by at least one computer processor, e.g., as part of any of the modules in system 100. Certain embodiments comprise computer program products comprising a computer readable storage medium having computer readable program embodied therewith and configured to carry out the relevant stages of method 200. In any of the disclosed embodiments, the computing resource may comprise any of: a centralized quantum computer, a network of quantum computers, a network of co-optimized quantum and classical computers and/or a network service comprising any thereof. Method 200 may comprise the following stages, irrespective of their order.

Method 200 may comprise, in various embodiments, deriving and updating dynamic sampling plans that provide wafer-specific measurement sites and conditions, wherein the dynamic sampling plans differ between wafers (stage 210) and/or deriving optimized wafer measurement paths for metrology measurements of the wafers that correspond to the respective derived and updated dynamic sampling plan (stage 220). Method 200 further comprises managing FOUP (Front Opening Unified Pod) transport through the fab, transporting wafers to measurement tools (stage 230) while providing the dynamic sampling plans and the wafer measurement paths to the respective measurement tools before or as the FOUPs with the respective wafers are transported thereto (stage 240), and carrying out metrology and/or inspection measurements of the respective wafers by the respective measurement tools according to the derived wafer measurement paths (stage 250).

Method 200 may further comprise using dedicated processor(s), which may comprise quantum processor(s) to calculate and/or optimize the dynamic sampling plan (stage 212), to calculate and/or optimize the wafer measurement path (stage 222) and/or to calculate and/or optimize the FOUP transport (stage 232).

In certain embodiments, method 200 may comprise using TSP or equivalent algorithms to calculate and/or optimize the wafer measurement path, which may be adjusted for implementation by quantum computers or processors (stage 224).

In certain embodiments, method 200 may comprise supporting, computationally, the respective measurement tools in their derivation of optimized wafer measurement paths for metrology measurements from the respective derived and updated dynamic sampling plan (stage 225), e.g., to enhance computational power, reduce computational time and alleviate the processors of the measurement tools.

In certain embodiments, the measurement tools may comprise at least one stepwise operating metrology tool and at least one scanning metrology tool, and method 200 may further comprise co-optimizing the FOUP transport, the dynamic sampling plan and the wafer measurement paths with respect to an allocation of stepping and the scanning metrology tools, to minimize wafer measurement time (stage 228), e.g., with the scanning metrology tools being allocated to measure stretches of adjacent wafer sites.

In certain embodiments, method 200 may further comprise applying big data analysis procedures to analyze the metrology and/or inspection measurements (stage 260) and optionally updating the dynamic sampling plans according to the analyzed metrology and/or inspection measurements (stage 270). Method 200 may further comprise using dedicated processor(s), which may comprise quantum processor(s) to carry out the big data analysis procedures (stage 262).

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A system for optimizing wafer transport and metrology measurements in a semiconductor fabrication plant (fab), the system comprising:

at least one processor configured to:

derive and update dynamic sampling plans that provide wafer-specific measurement sites and conditions, wherein the dynamic sampling plans differ between wafers, derive optimized wafer measurement paths for metrology measurements of the wafers that correspond to the respective derived and updated dynamic sampling plan, and manage Front Opening Unified Pod (FOUP) transport through the fab, transporting wafers to measurement tools while providing the optimized wafer measurement paths to the respective measurement tools before or as the FOUPs with the respective wafers are transported thereto, wherein the respective measurement tools are metrology tools or inspection tools configured to carry out metrology and/or inspection measurements of the respective wafers according to the derived optimized wafer measurement paths, and wherein the processor comprises at least one quantum computer.

2. The system of claim 1, wherein the deriving and updating the dynamic sampling plan is associated with a dedicated processor configured to carry out the optimization of the dynamic sampling plan, wherein the dedicated processor comprises at least one quantum computer.

3. The system of claim 1, wherein the deriving the optimized wafer measurement paths is associated with a dedicated processor configured to carry out the optimization of the wafer measurement path, wherein the dedicated processor comprises at least one quantum computer.

4. The system of claim 3, wherein the deriving optimized wafer measurement paths is configured to optimize the wafer measurement path with respect to wafer measurement speed and according to a given measurement time specified by the dynamic sampling plan.

5. The system of claim 1,
wherein the measurement tools comprise at least one stepwise operating metrology tool and at least one scanning metrology tool,
the processor is further configured to co-optimize the dynamic sampling plan and the wafer measurement paths with respect to an allocation of stepping and the scanning metrology tools, to such that the dynamic sampling plan and the wafer measurement paths have a lowest wafer measurement time,
wherein the scanning metrology tools are allocated to measure stretches of adjacent wafer sites.

6. The system of claim 1, wherein the managing the FOUP transport is associated with a dedicated processor configured to carry out the optimization of the FOUP transport, wherein the dedicated processor comprises at least one quantum computer.

7. The system of claim 1, wherein the processor is further configured to:
apply big data analysis procedures to analyze the metrology and/or inspection measurements;
update the dynamic sampling plan according to the analyzed metrology and/or inspection measurements.

8. The system of claim 7, wherein the applying the big data analysis procedures and the updating the dynamic sampling plan is associated with a dedicated processor, wherein the dedicated processor comprises at least one quantum computer.

9. The system of claim 1, further comprising a system controller configured to receive reports and log files from process tools and/or control the wafer transport and metrology measurements optimization in the fab.

10. The system of claim 9, wherein the system controller comprises at least one of: a centralized quantum computer, a network of quantum computers, a network of co-optimized quantum and classical computers and/or a network service comprising any thereof.

11. A system for optimizing wafer transport and metrology measurements in a semiconductor fabrication plant (fab), the system comprising:

at least one processor configured to:
derive and update dynamic sampling plans that provide wafer-specific measurement sites and conditions, wherein the dynamic sampling plans differ between wafers, and
manage Front Opening Unified Pod (FOUP) transport through the fab, transporting wafers to measurement tools while providing the dynamic sampling plans to the respective measurement tools before or as the FOUPs with the respective wafers are transported thereto, wherein the measurement tools are metrology tools or inspection tools,
wherein the respective measurement tools are configured to carry out metrology and/or inspection measurements of the respective wafers according to the provided dynamic sampling plans, and wherein the processor comprises at least one quantum computer.

12. The system of claim 11, wherein the deriving and updating the dynamic sampling plans is associated with a dedicated processor configured to carry out the optimization of the dynamic sampling plans, wherein the dedicated processor comprises at least one quantum computer.

13. The system of claim 11, wherein the processor is further configured to support, computationally, the respective measurement tools in their derivation of optimized wafer measurement paths for metrology measurements from the respective derived and updated dynamic sampling plan.

14. The system of claim 11,
wherein the measurement tools comprise at least one stepwise operating metrology tool and at least one scanning metrology tool,
the processor is further configured to co-optimize the dynamic sampling plan and the wafer measurement paths with respect to an allocation of stepping and the scanning metrology tools, such that the dynamic sampling plan and the wafer measurement paths have a lowest wafer measurement time,
wherein the scanning metrology tools are allocated to measure stretches of adjacent wafer sites.

15. The system of claim 11, wherein the managing FOUP transport is associated with a dedicated processor configured to carry out the optimization of the FOUP transport, wherein the dedicated processor comprises at least one quantum computer.

16. The system of claim 11, wherein the processor is further configured to:
apply big data analysis procedures to analyze the metrology and/or inspection measurements; and
update the dynamic sampling plan according to the analyzed metrology and/or inspection measurements.

17. The system of claim 16, wherein the applying the big data analysis procedures and the updating the dynamic sampling plan is associated with a dedicated processor configured to carry out the big data analysis.

18. The system of claim 11, further comprising a system controller configured to receive reports and log files from process tools and/or control the wafer transport and metrology measurements optimization in the fab.

19. The system of claim 18, wherein the system controller comprises at least one of: a centralized quantum computer, a network of quantum computers, a network of co-optimized quantum and classical computers and/or a network service comprising any thereof.

20. A system for optimizing wafer transport and metrology measurements in a semiconductor fabrication plant (fab), the system comprising:

at least one processor configured to:

derive optimized wafer measurement paths for metrology measurements of the wafers according to dynamic sampling plans that provide wafer-specific measurement sites and conditions and differ between wafers, and manage Front Opening Unified Pod (FOUP) transport through the fab, transporting wafers to measurement tools while providing the derived wafer measurement paths to the respective measurement tools before or as the FOUPs with the respective wafers are transported thereto, wherein the measurement tools are metrology tools or inspection tools, wherein the respective measurement tools are configured to carry out metrology and/or inspection measurements of the respective wafers according to the derived wafer measurement paths, and wherein the processor comprises at least one quantum computer.

21. The system of claim 20, wherein the deriving the optimized wafer measurement paths is associated with a dedicated processor configured to carry out the optimization of the wafer measurement path, wherein the dedicated processor comprises at least one quantum computer.

22. The system of claim 21, wherein the deriving the optimized wafer measurement paths is configured to optimize the wafer measurement path with respect to wafer measurement speed and according to a given measurement time specified by the dynamic sampling plan.

23. The system of claim 21, wherein the deriving the optimized wafer measurement paths is configured to optimize the wafer measurement path by implementing at least one Travelling Salesman Problem (TSP) algorithm.

24. The system of claim 23, wherein the dedicated processor comprises at least one quantum computer and wherein the at least one TSP algorithm is adjusted to be processed by the at least one quantum computer.

25. The system of claim 20,
wherein the measurement tools comprise at least one stepwise operating metrology tool and at least one scanning metrology tool,
the processor is further configured to co-optimize the dynamic sampling plan and the wafer measurement paths with respect to an allocation of stepping and the scanning metrology tools, such that the dynamic sampling plan and the wafer measurement paths have a lowest wafer measurement time,
wherein the scanning metrology tools are allocated to measure stretches of adjacent wafer sites.

26. The system of claim 20, wherein the managing FOUP transport is associated with a dedicated processor configured to carry out the optimization of the FOUP transport, wherein the dedicated processor comprises at least one quantum computer.

27. The system of claim 20, wherein the processor is further configured to apply big data analysis procedures to analyze the metrology and/or inspection measurements.

28. The system of claim 27, wherein the applying the big data analysis procedures is associated with a dedicated processor configured to carry out the big data analysis, wherein the dedicated processor comprises at least one quantum computer.

29. The system of claim 20, further comprising a system controller configured to receive reports and log files from process tools and/or control the wafer transport and metrology measurements optimization in the fab.

30. The system of claim 29, wherein the system controller comprises at least one of: a centralized quantum computer, a network of quantum computers, a network of co-optimized quantum and classical computers and/or a network service comprising any thereof.

* * * * *